United States Patent [19]

Hsia et al.

[11] Patent Number: 6,147,409
[45] Date of Patent: Nov. 14, 2000

[54] MODIFIED MULTILAYERED METAL LINE STRUCTURE FOR USE WITH TUNGSTEN-FILLED VIAS IN INTEGRATED CIRCUIT STRUCTURES

[75] Inventors: Shouli Steve Hsia, San Jose, Calif.; Fred Chen, Hsin-Chu, Taiwan; Jiunn-Yann Tsai, San Jose, Calif.

[73] Assignee: LSI Logic Corporation, Milpitas, Calif.

[21] Appl. No.: 09/098,019

[22] Filed: Jun. 15, 1998

[51] Int. Cl.[7] .......................... H01L 23/48; H01L 23/52; H01L 29/40
[52] U.S. Cl. .......................... 257/763; 257/764; 257/765
[58] Field of Search .................................. 257/763, 765, 257/750, 764, 771, 774; 438/627, 634, 636

[56] References Cited

U.S. PATENT DOCUMENTS

| | | | |
|---|---|---|---|
| 5,360,995 | 11/1994 | Grass | 257/751 |
| 5,475,267 | 12/1995 | Ishii et al. | 257/752 |
| 5,600,182 | 2/1997 | Schinella et al. | 257/763 |
| 5,635,763 | 6/1997 | Inoue et al. | 257/763 |
| 5,719,446 | 2/1998 | Taguchi et al. | 257/751 |
| 5,793,113 | 8/1998 | Oda | 257/774 |
| 5,817,574 | 10/1998 | Gardner | 438/637 |

*Primary Examiner*—Olik Chaudhuri
*Assistant Examiner*—Phat X. Cao
*Attorney, Agent, or Firm*—John P. Taylor

[57] ABSTRACT

A composite metal line structure for an integrated circuit structure on a semiconductor substrate is disclosed which comprises: a low resistance metal core layer; a first thin protective layer of electrically conductive material on the upper surface of the metal core layer capable of protecting the metal core layer from reaction with tungsten; a layer of tungsten formed over the first protective layer to function as an etch stop layer for vias subsequently formed in an overlying dielectric layer; and a second thin protective layer of electrically conductive material over the tungsten layer and capable of functioning as an antireflective coating (ARC). When a dielectric layer is formed over the composite metal line structure, tungsten-filled vias can be formed in the dielectric layer which will extend down through the second thin protective layer to provide direct electrical contact between the tungsten-filled via and the tungsten layer of the composite metal line structure, thereby providing a low resistance contact between the tungsten-filled via and the composite metal line structure.

5 Claims, 4 Drawing Sheets

MODIFIED MULTILAYERED METAL LINE STRUCTURE FOR USE WITH TUNGSTEN-FILLED VIAS IN INTEGRATED CIRCUIT STRUCTURES

BACKGROUND OF THE INVENTION

1. Field of the Invention

This invention relates to integrated circuit structures. More particularly, this invention relates to a modified multiple layer metal line for use with tungsten-filled vias in an integrated circuit structure.

2. Description of the Related Art

Metal lines, used in the construction of an integrated circuit structure to provide electrical communication between various active and passive devices in the circuitry of the integrated circuit structure, are usually constructed as multilayer structures. The center or core layer of the multilayer line is a metal layer selected for its high electrical conductivity, i.e., its low resistance. However, since the high conductivity core metal layer sometimes is reactive with other materials in the integrated circuit structure, i.e., with the tungsten used to fill vias electrically connected to the metal line, it is customary to place one or more protective layers of electrically conductive material over and under the core metal layer. Furthermore, to inhibit undesirable reflectance from the metal line (which can interfere with the photolithography used to form further structure over the metal layers which will be patterned into metal lines), it is also conventional to provide an anti-reflective coating (ARC) layer of electrically conductive material over such multilayer metal lines. However, such protective layers of electrically conductive material are basically chosen for their protective value, not their superior electrical conductivity. The resistance of such protective layers, while low enough to qualify the protective material as electrically conductive, is usually higher than the resistance of the metal core layer.

FIG. 1 shows a typical prior art composite or multilayer metal line structure 4 formed over a portion of an integrated circuit structure 2, such as, for example, a dielectric layer formed over a semiconductor substrate. Composite metal line structure 4 comprises a Ti/TiN or TiN protective lower layer 10; a central core metal layer 20, which may comprise any conventional highly conductive metal such as, for example, gold, aluminum, copper, or an aluminum-copper alloy which may optionally also contain silicon; and a top layer 30 of either Ti/TiN or TiN which doubles as both a protective layer for the underlying core metal layer and as an ARC layer.

Upper Ti/TiN or TiN layer 30 also acts as an etch stop when a further dielectric layer 40, e.g., a SiO$_2$ layer, is formed over composite metal line structure 4, as shown in prior art FIG. 2, and a via 44 is etched through dielectric layer 40 down to (and, in this case for illustrative purposes, through) Ti/TiN or TiN layer 30. Because of this additional function of Ti/TiN or TiN layer 30 as an etch stop layer, it is usually constructed thicker than would be necessary for layer 30 to function merely as either an ARC layer or a protective layer to isolate the tungsten filler material eventually used to fill the via from core metal layer 20 in composite metal line structure 4.

For example, lower Ti/TiN or TiN layer 10, which only acts as a protective layer, usually ranges in thickness from about 5 nanometers (nm) to about 50 nm. Typically the thickness of layer 10 is about 25 nm. (250 Angstroms) In contrast, however, upper Ti/TiN or TiN layer 30 (which functions not only as a protective layer, but also as an ARC layer, and as an etch stop layer) usually ranges in thickness from at least 50 nm to about 100 nm, and typically the thickness of layer 30 is about 70 nm (700 Angstroms). That is, upper layer 30, to also function as an etch stop layer as well, must be substantially thicker than lower layer 10. However, since Ti/TiN or TiN comprises a high resistance electrically conductive material (relative to the resistance of core metal layer 20), it is also desirable to make layer 30 as thin as possible.

Furthermore, as shown in FIG. 2, it is customary, in the construction of a tungsten-filled via 44 in dielectric layer 40 over a composite metal line structure 4, to line not only the walls of via 44 with a material such as TiN, as shown at 46, to assure good adhesion of tungsten filler material 50 to the SiO$_2$ walls of via 44, but also to line the bottom of via 44 with TiN as well, as shown at 48. The bottom liner 48 of TiN provides additional protection from a reaction between tungsten filler material 50 in via 44 and metal core layer 20 in composite metal line structure 4, just in case the etch step used to form via 44 in dielectric layer 40 penetrates through etch stop Ti/TiN or TiN layer 30 (as in the illustration of FIG. 2). This lining of the bottom of via 44 with a high resistance material like TiN adds yet further resistance to the structure, particularly when, as shown in FIG. 3, the etching of via 44 through dielectric layer 40 does stop (as intended) at the upper surface of Ti/TiN or TiN etch stop layer 30.

It would, therefore, be desirable to provide a composite metal line structure wherein the tungsten in a via subsequently constructed over the composite metal line structure would be isolated from the core metal material in the composite metal line structure, and ARC protection would be provided at the upper surface of the composite metal line, yet the need to line the bottom of the via with additional TiN, and the need to provide a thick upper layer of high resistance Ti/TiN or TiN in composite metal line structure 4 to act as an etch stop in the subsequent formation of vias, would all be eliminated.

SUMMARY OF THE INVENTION

An improved composite metal line structure for an integrated circuit structure, and process of making same, comprises: a low resistance metal core layer; a first thin protective layer on the upper surface of the metal core layer capable of protecting the metal core layer from reaction with tungsten; a layer of tungsten formed over the first protective layer to function as an etch stop layer for vias subsequently formed in an overlying dielectric layer; and a second thin protective layer over the tungsten layer and capable of functioning as an antireflective coating (ARC).

DETAILED DESCRIPTION OF THE INVENTION

The invention comprises an improved composite metal line structure for an integrated circuit structure, and process of making same. The composite metal line structure of the invention comprises: an optional thin lower protective layer on the lower surface of the metal core layer, a low resistance metal core layer; a first thin upper protective layer of electrically conductive material on the upper surface of the metal core layer capable of protecting the metal core layer from reaction with tungsten; a layer of tungsten formed over the first thin upper protective layer to function as an etch stop layer for vias subsequently formed in an overlying dielectric layer; and a second thin upper protective layer of electrically conductive material over the tungsten layer and capable of also functioning as an antireflective coating (ARC).

By use of the term "low resistance", with respect to the metal core layer is meant an electrical resistivity of about 2–4 microohm-centimeters ($\mu\Omega$-cm), as opposed to the protective layers of electrically conductive material which each typically have an electrical resistivity of from about 100 to about 250 $\mu\Omega$-cm.

By use of the term "thin", in the expressions "lower thin protective layer" located beneath the metal core layer, "first thin upper protective layer" located over the metal core layer and under the tungsten layer, and "second thin upper protective layer" formed over the tungsten layer, is meant a layer which varies in thickness from about 5 nm (50 Angstroms) to about 20 nm (200 Angstroms). Preferably, the thickness of each of the three thin protective layers varies from about 5 nm to about 15 nm, and most preferably from about 8 nm to about 12 nm, with the typical thickness of each of the thin protective layers being about 10 nm. In each instance, the thickness of the particular "thin" protective layer is kept to a minimum to keep from unduly adding to the resistance of the structure, while still providing sufficient thickness to provide the desired protection against interaction between layers adjacent the respective opposite surfaces of the protective layer.

Figure 4:
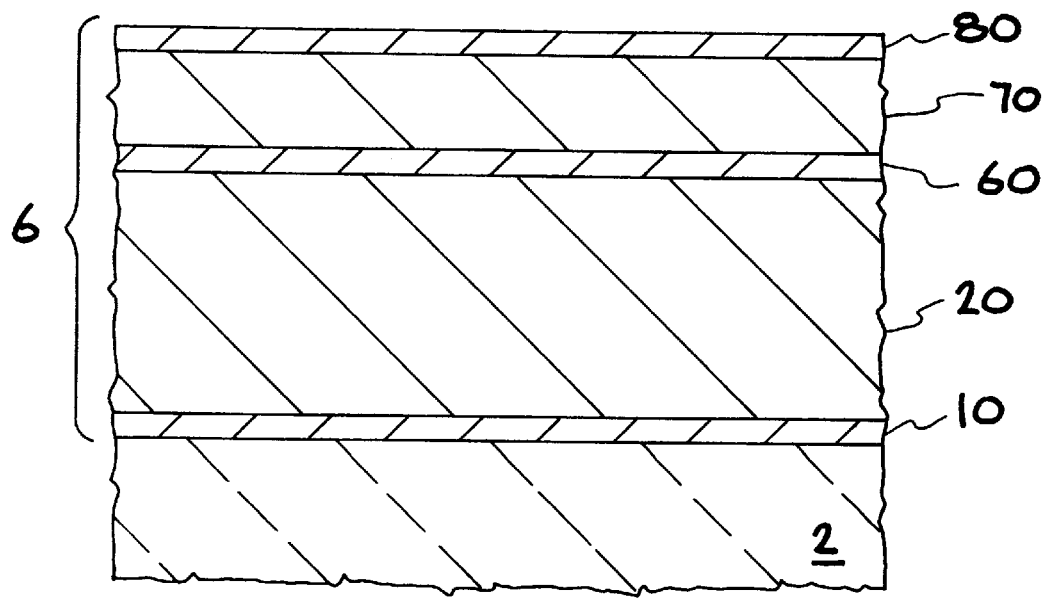
FIG. 4 is a fragmentary vertical cross-sectional view of the composite metal line structure of the invention, showing the elimination of the thick Ti/TiN or TiN etch stop layer.

Turning now to FIG. 4, the composite metal line structure of the invention is generally illustrated at 6 comprising a lower thin protective layer 10; a central core metal layer 20; a first thin upper protective layer 60 formed over metal core layer 20; a tungsten layer 70; and a second thin upper protective layer 80 formed over tungsten layer 70. Composite metal line structure 6 is formed over an integrated circuit structure 2 such as, for example, a dielectric layer formed over a semiconductor substrate.

Lower thin protective layer 10 may be formed of either Ti/TiN or TiN or any other suitable electrically conductive material capable of preventing reaction between metal core layer 20 and the materials in underlying integrated circuit structure 2. In some circumstances, depending upon the material present in integrated circuit structure 2 directly below composite metal line structure 6, lower protective layer 10 may be omitted from composite metal line structure 6. The term "Ti/TiN", as used herein, is intended to mean either a titanium layer which has been annealed in a nitrogen atmosphere to at least partially convert the titanium to titanium nitride; or a thin titanium layer (e.g., ~20 Å–200 Å) on which is deposited a thin TiN layer by a separate process step.

Metal core layer 20, as previously described, may comprise any conventional highly conductive metal such as, for example, gold, aluminum, copper, or an aluminum-copper alloy which may optionally also contain silicon, i.e., an aluminum-copper-silicon alloy. The thickness of metal core layer 20, which will carry the bulk of the current passing through composite metal line structure 6, will range from about 500 nm (0.5 $\mu$m) to about 1500 nm (1.5 $\mu$m).

Over the upper surface of metal core layer 20 is formed first thin upper protective layer 60. First thin upper protective layer 60 may be formed of either Ti/TiN or TiN or any other suitable electrically conductive material capable of preventing reaction between metal core layer 20 and tungsten layer 70 which will be formed over first upper protective layer 60.

In accordance with the invention, tungsten layer 70 is then formed over first thin upper protective layer 60. Since the purpose of tungsten layer 70 is to provide an etch stop layer for the formation of a via through an insulation layer formed over composite metal line structure 6, it is important that tungsten layer be thick enough to inhibit accidental etching of via 44 through the thickness of tungsten layer 70, since underlying first thin upper protective layer 60 is not intended to provide protection against over etching of via 44. At the same time, tungsten layer 70 should not be so thick as to provide undue bulk or thickness to composite metal line structure 6. Tungsten layer 70, therefore, should be formed to a thickness ranging from about 20 nm to about 100 nm, preferably to a thickness ranging from about 40 nm to about 70 nm, and typically to a thickness of about 50 nm.

Over tungsten layer 70 is formed second thin upper protective layer 80. Second thin upper protective layer 80 may be formed of either Ti/TiN or TiN or any other suitable electrically conductive material capable of preventing reaction between tungsten layer 70 and any structure which will be formed over second upper protective layer 80, i.e., over composite metal line structure 6. Second thin upper protective layer 80 also functions as an ARC layer which permits photolithographic processing to be carried out over ARC layer 80 without interfering reflection from the layers comprising composite metal line structure 6.

Figure 1:
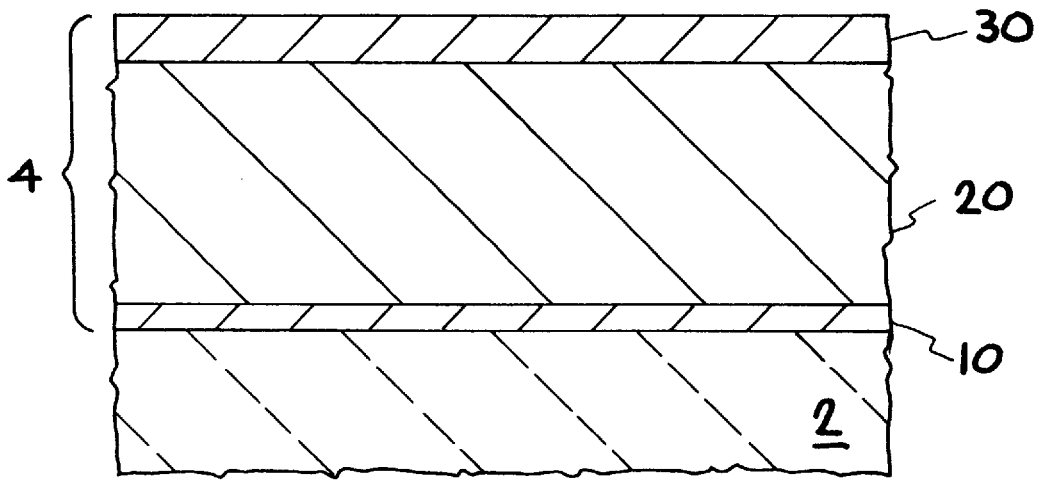
FIG. 1 is a fragmentary vertical cross-sectional view of a prior art composite metal line structure, showing the thick Ti/TiN or TiN layer provided over the metal core layer to permit functioning of the Ti/TiN or TiN layer as an etch stop for formation of vias in a subsequently formed overlying dielectric layer.
Figure 2:
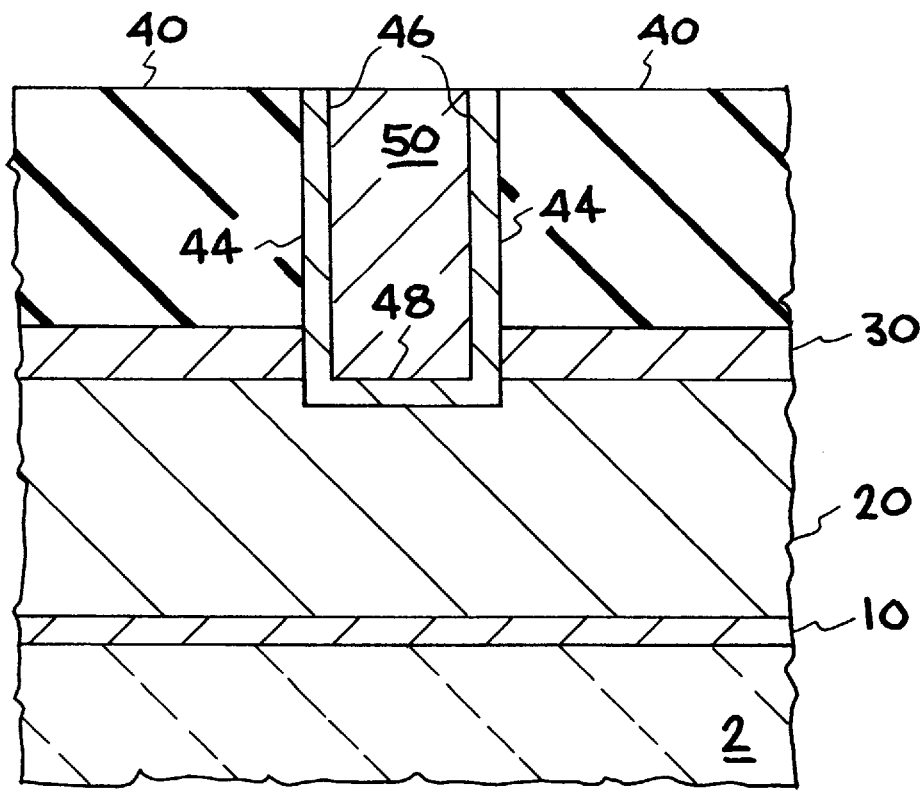
FIG. 2 its a fragmentary vertical cross-sectional view of the prior art composite metal line structure of FIG. 1, showing a filled via formed over the composite metal line, with the via having penetrated through the thick Ti/TiN or TiN etch stop layer.
Figure 3:
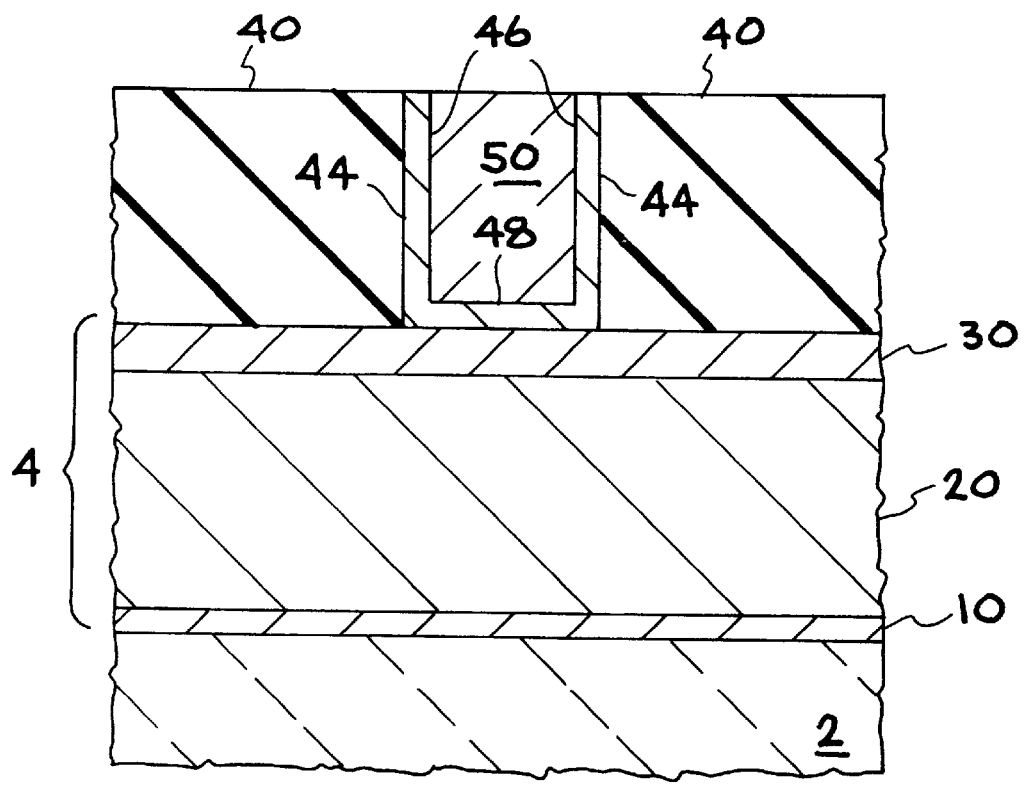
FIG. 3 is a fragmentary vertical cross-sectional view of the prior art composite metal line structure of FIG. 1, showing a filled via formed over the composite metal line, with the via not having penetrated through the thick Ti/TiN or TiN etch stop layer.
Figure 5:
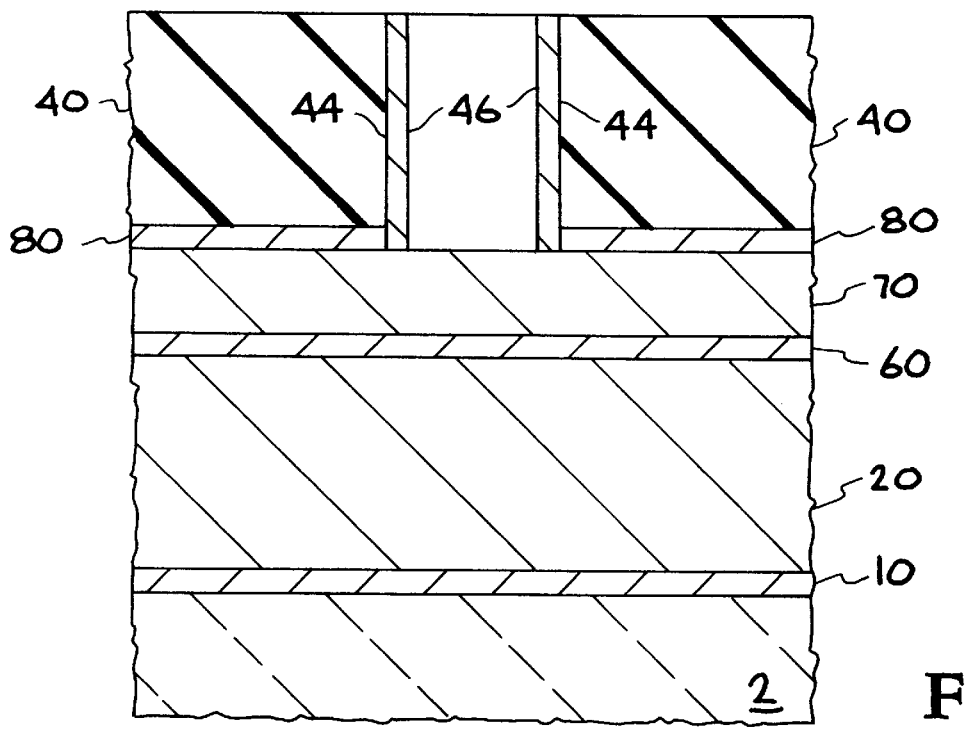
FIG. 5 is a fragmentary vertical cross-sectional view of the composite metal line structure of FIG. 4 after formation and sidewall lining of a via in an overlying dielectric layer, showing both the elimination of the prior art thick Ti/TiN or TiN etch stop layer (shown in prior art FIGS. 1–3) and the elimination of the prior art bottom liner of TiN in the via (shown in prior art FIGS. 2–3).

Turning now to FIG. 5, the advantages of composite metal liner structure 6 over prior art composite metal line structures such as prior art composite metal line structure 4 of FIGS. 1–3 will be shown. In FIG. 5, after completion of composite metal line structure 6 of the invention, i.e., after completion of second thin upper protective layer 80, a dielectric layer 40, such as a layer of $SiO_2$, is shown formed over composite metal line structure 6. A via 44 is formed through dielectric layer 40 to tungsten layer 70 in underlying composite metal line structure 6 using an etchant system which is selective to tungsten, but which will etch both the material forming dielectric layer 40 and second thin upper protective layer 80. For example, when dielectric layer 40 comprises $SiO_2$ and second thin upper protection layer 80 comprises TiN, a plasma etchant system such as a mixture of $CF_4$ and $CHF_3$ can be used which will etch both $SiO_2$ and TiN in preference to the etching of tungsten layer 70. The result, as shown in FIG. 5, is the etching of via 44 down to the level of tungsten layer 70.

After formation of via 44 in dielectric layer 40, and through second thin upper protective layer 80 down to tungsten layer 70, the sidewall surfaces of via 44 (the via surfaces passing through dielectric layer 40) are then lined with TiN, as shown at 46 in FIG. 5, using a PVD (sputtering) deposition. It will be noted, however, that the prior art bottom liner 48 of prior art FIGS. 2 and 3 has been eliminated, since there is now no need to protect the subsequent tungsten filler in via 44 from interaction with metal core layer 20 in view of the presence of tungsten layer 70 in the composite metal line structure 6 of the invention.

This elimination of bottom TiN liner 48 is important from an electrical standpoint since one layer of potentially high resistance (between the tungsten-filled via and the composite metal line structure) has now been eliminated. It is also important from a processing standpoint, since the formation of prior art bottom liner 48 of TiN was conventionally carried out in a CVD process, while the deposition of TiN sidewall liner 46 on the sidewalls of via 44 was done using a PVD process. Thus, in the prior art processing, it was necessary to physically move the semiconductor substrate from a PVD chamber (used, for example, to form TiN sidewall liner 46) to a CVD chamber (used to form TiN bottom liner 48) and then to a CVD chamber (to fill via 44 with tungsten). Thus, the step of moving the substrate from a PVD chamber to the CVD chamber for the deposition of TiN on the bottom wall, is eliminated when using the composite metal line structure of the invention with tungsten-filled vias.

Figure 6:
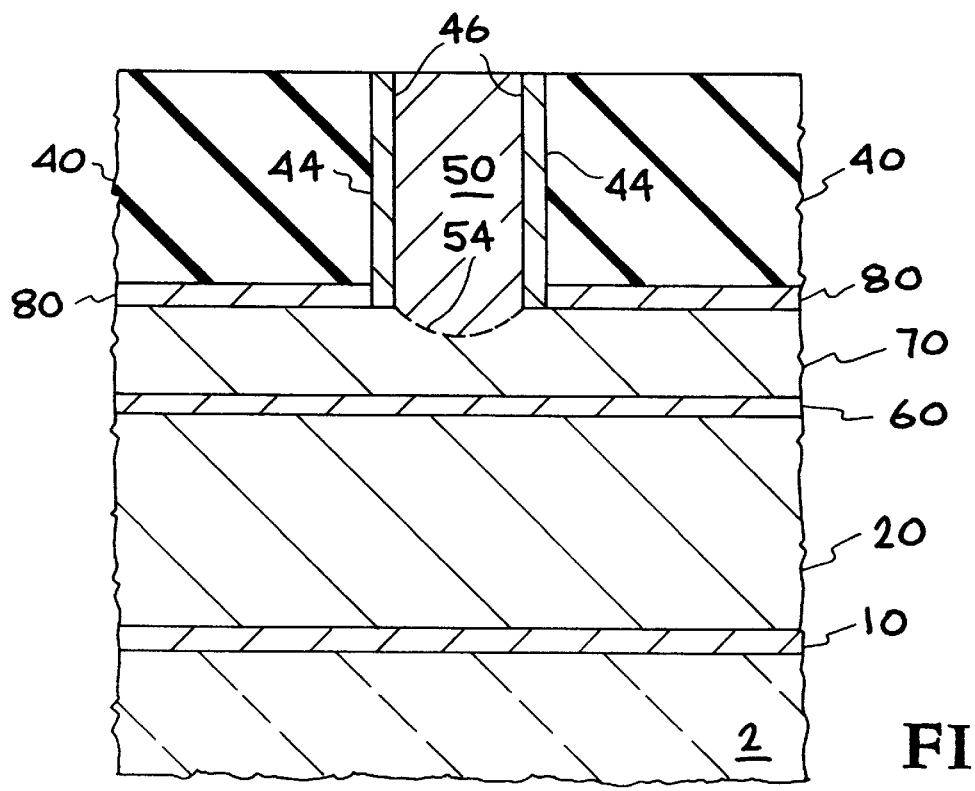
FIG. 6 is a fragmentary vertical cross-sectional view of the structure of FIG. 5 after filling of the via with tungsten, to illustrate the direct contact of the tungsten in the via with the tungsten layer in the composite metal line structure of the invention.

Turning now to FIG. 6, after formation of via 44 and the lining of the dielectric sidewalls of via 44 with TiN liner 46, via 44 is filled with tungsten 50. The tungsten used to provide tungsten filler 50 in via 44 then merges with tungsten layer 70 of composite metal line structure 70, as shown at dotted line 54 in FIG. 6 (for illustrative purposes), resulting in a direct physical and electrical connection between tungsten 50 in via 44 and tungsten layer 70 of composite metal line structure 6.

In comparing the connection of the composite metal line structure 6 of the invention with the tungsten-filled via shown in FIG. 6 versus the prior art composite metal line structure 4 connected with the tungsten-filled via shown in prior art FIG. 3, it will be noted that two thicknesses of high resistance Ti/TiN or TiN material between tungsten 50 in via 44 and prior art composite metal line structure 4 in prior art FIG. 3 (Ti/TiN or TiN layer 30 and TiN liner 48) have been eliminated in the structure of the invention shown in FIG. 6 and replaced with a single thickness comprising Ti/TiN or TiN first thin upper protective layer 60.

Figure 7:
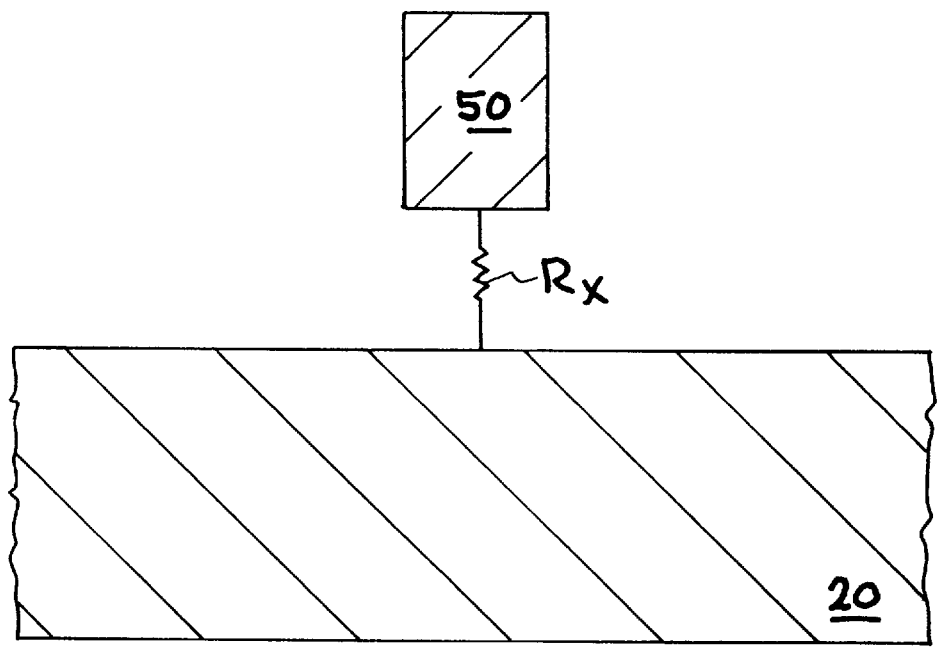
FIG. 7 is a schematic view showing the equivalent resistance of the prior art structures of FIGS. 2 and 3 from the tungsten-filled via to the metal core layer of the composite metal line structure, with a resistor shown substituted for the Ti/TiN or TiN layer(s) in between the tungsten filled via and the metal core layer.
Figure 8:
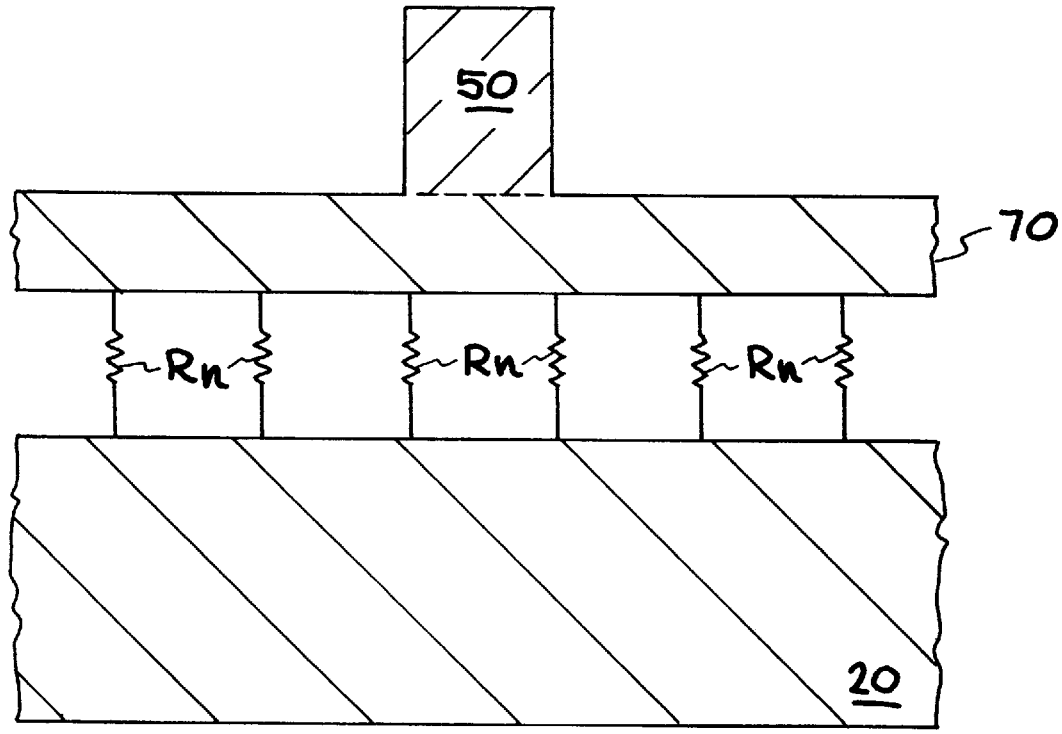
FIG. 8 is a schematic view showing the equivalent resistance of the structure of the invention shown in FIG. 6 from the tungsten-filled via to the metal core layer of the composite metal line structure, with a series of parallel resistors shown substituted for the single thin Ti/TiN or TiN layer in between the tungsten layer of the composite metal line structure and the metal core layer.

However, the reduction in resistance between tungsten filer material 50 in via 44 and metal core layer 20 in composite metal line structure 6 of the invention, as opposed to the prior art structure of FIG. 3, is actually even more dramatic, as illustrated in FIGS. 7 and 8.

FIG. 7 shows the combined thicknesses of TiN liner 48 and thick etch stop Ti/TiN or TiN layer 30 replaced by a single resistor $R_x$, representing, in this instance, the total resistance of the area of via 44 through the thicknesses of both liner 48 and layer 30, when prior art composite metal line structure 4 is connected to tungsten-filled via 44. While the value of $R_x$ would be reduced if the prior art structure of FIG. 2 would be substituted for the prior art structure of FIG. 3, $R_x$ would still be represented by a single resistor.

In contrast, FIG. 8 shows the equivalent resistance when composite metal line structure 6 of the invention is substituted for prior art composite metal line structure 4 of the prior art. In the first place, it will be noted the thickness of via bottom TiN liner 48 has been eliminated. Next it will be noted that thick etch stop Ti/TiN or TiN layer 30 of the prior art has also been eliminated (since there is no need nor desire to stop the etching of via 44 before tungsten layer 70 is reached). Finally, it will be noted that the only high resistance layer remaining between tungsten-filled via 44 and metal core layer 20 of composite metal line structure 6 of the invention is first thin upper protective Ti/TiN or TiN layer 60, and this layer is depicted in FIG. 8 by a series of resistors $R_n$, thus denoting a much lower resistance than a single resistor. The reason that Ti/TiN or TiN layer 60 is shown replaced by a series of parallel resistors $R_n$ rather than a single resistor (as in FIG. 7) is that the resistance of Ti/TiN or TiN layer 60 is spread across a large area representing the total area of metal core layer 20 and the total area of tungsten layer 70 separated by Ti/TiN or TiN layer 60 (since in FIG. 8, there is a direct tungsten-tungsten electrical bond between tungsten 50 in via 44 and tungsten layer 70 in composite metal line structure 6). Thus, as in a series of parallel resistors, the effective resistance between tungsten layer 70 and metal core layer 20 across Ti/TiN or TiN layer 60 is much lower than the prior art resistance depicted in FIG. 7, since it is spread over a much larger area than in the prior art construction.

Thus, the composite metal line structure of the invention eliminates the need for a thick etch stop protective layer over the metal core layer of the composite metal line structure of the invention. Furthermore, the composite metal line structure of the invention eliminates the need for a bottom liner in a via formed in a dielectric layer placed over the composite metal line structure of the invention to protect tungsten in the via from the composite metal line structure. This, in turn, eliminates the need to move the substrate containing the composite metal line structure of the invention from the TiN PVD chamber to a TiN CVD chamber to line both the sidewalls and bottom of the via.

Having thus described the invention what is claimed is:

1. An improved integrated circuit structure comprising a composite metal interconnect structure with an aluminum-containing metal core layer, and with direct electrical and metallurgical connection between a tungsten layer in the composite metal interconnect structure and a tungsten filler material in an overlying via which comprises:

a) an integrated circuit structure formed on a semiconductor substrate;

b) a first layer of dielectric material formed over said integrated circuit structure;

c) a first protective barrier layer comprising a TiN-containing electrically conductive material formed on an upper surface of said first layer of dielectric material;

d) an aluminum-containing core layer formed on said first protective barriers layer, whereby said first protective barrier layer inhibits interaction between said first dielectric layer and said aluminum layer;

e) a second protective barrier layer comprising a TiN-containing electrically conductive material formed on the upper surface of said aluminum-containing core layer to inhibit interaction between said aluminum-containing core layer and materials formed over said aluminum-containing core layer;

f) a layer of tungsten formed on the upper surface of said second protective barrier layer capable of functioning as an etch stop layer for vias subsequently formed in an overlying dielectric layer, said second protective barrier layer inhibiting interaction between said aluminum-containing core layer and said tungsten layer;

g) a third protective barrier layer comprising a TiN-containing electrically conductive material formed on an upper surface of said tungsten layer and capable of functioning as an antireflective coating (ARC), whereby said first, second, and third protective barrier layers of TiN-containing electrically conductive material, said aluminum-containing core layer, and said tungsten layer comprise said composite metal interconnect structure, with said first, second, and third protective barrier layers protecting said aluminum-containing layer and said tungsten layer from interaction with one another or with other adjacent materials;

h) a second dielectric layer formed over said third protective barrier layer;

i) one or more vias formed in said second dielectric layer, and extending through said second dielectric layer and through said third protective barrier layer down into said tungsten layer;

j) a layer of TiN formed on the sidewalls of said vias to promote adhesion of tungsten via filler material with the sidewalls of said one or more vias; and k) electrically conductive tungsten filler material in said one or more vias and metallurgically and electrically connected with said tungsten layer of said composite metal interconnect structure through the unlined bottom of said one or more vias;

to thereby provide a low resistance electrical connection between said tungsten-filled one or more vias and said aluminum-containing core layer of said composite metal interconnect structure.

2. The composite metal interconnect structure of claim 1 wherein said tungsten layer ranges in thickness from about 20 nm to about 100 nm.

3. The composite metal interconnect structure of claim 1 wherein said tungsten layer ranges in thickness from about 40 nm to about 70 nm.

4. The composite metal interconnect structure of claim 1 wherein said first protective layer of electrically conductive material ranges in thickness from about 5 nm to about 20 nm.

5. The composite metal interconnect structure of claim 1 wherein said second protective layer of electrically conductive material ranges in thickness from about 5 nm to about 20 nm.

* * * * *